United States Patent
Dubey et al.

(10) Patent No.: US 9,978,710 B2
(45) Date of Patent: May 22, 2018

(54) METHOD FOR SELF-ALIGNED SOLDER REFLOW BONDING AND DEVICES OBTAINED THEREOF

(71) Applicants: IMEC VZW, Leuven (BE); Katholieke Universiteit Leuven, Leuven (BE)

(72) Inventors: Vikas Dubey, Leuven (BE); Eric Beyne, Heverlee (BE); Jaber Derakhshandeh, Tienen (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days. days.

(21) Appl. No.: 15/385,653

(22) Filed: Dec. 20, 2016

(65) Prior Publication Data
US 2017/0194283 A1    Jul. 6, 2017

(30) Foreign Application Priority Data

Dec. 24, 2015 (EP) ..................... 15202661

(51) Int. Cl.
*H01L 23/00* (2006.01)
*H01L 23/498* (2006.01)
(Continued)

(52) U.S. Cl.
CPC ........ *H01L 24/81* (2013.01); *H01L 23/49827* (2013.01); *H01L 24/03* (2013.01); *H01L 24/06* (2013.01); *H01L 24/13* (2013.01); *H01L 25/0657* (2013.01); *H01L 25/50* (2013.01); *H01L 2224/0401* (2013.01); *H01L 2224/0601* (2013.01); *H01L 2224/81143* (2013.01);
(Continued)

(58) Field of Classification Search
CPC ... H01L 24/81; H01L 23/49827; H01L 24/03; H01L 24/06; H01L 25/0657; H01L 25/50; H01L 24/13
See application file for complete search history.

(56) References Cited

U.S. PATENT DOCUMENTS 2,056,216 A    10/1936   Somers et al.
4,818,728 A    4/1989   Rai et al.
(Continued)

OTHER PUBLICATIONS

Extended European Search Report dated Mar. 30, 2016 in European Application No. 15202661.3.
(Continued)

*Primary Examiner* — William Coleman
(74) *Attorney, Agent, or Firm* — Knobbe Martens Olson & Bear LLP (57) ABSTRACT

A method for producing a stack of semiconductor devices and the stacked device obtained thereof are disclosed. In one aspect, the method includes providing a first semiconductor device comprising a dielectric layer with a hole, the hole lined with a metal layer and partially filled with solder material. The method also includes providing a second semiconductor device with a compliant layer having a metal protrusion through the compliant layer, the protrusion capped with a capping layer. The method further includes mounting the devices by landing the metal protrusion in the hole, where the compliant layer is spaced from the dielectric layer. The method includes thereafter reflowing the solder material, thereby bonding the devices such that the compliant layer is contacting the dielectric layer.

10 Claims, 4 Drawing Sheets

(51) Int. Cl.
    *H01L 25/065* (2006.01)
    *H01L 25/00* (2006.01)

(52) U.S. Cl.
    CPC ........... *H01L 2224/81815* (2013.01); *H01L 2225/06541* (2013.01); *H01L 2924/01013* (2013.01); *H01L 2924/01028* (2013.01); *H01L 2924/01029* (2013.01); *H01L 2924/01074* (2013.01)

(56) References Cited

U.S. PATENT DOCUMENTS

| | | | | |
|---|---|---|---|---|
| 5,329,423 | A * | 7/1994 | Scholz | H01L 23/32 174/263 |
| 6,800,169 | B2 * | 10/2004 | Liu | B32B 7/12 156/292 |
| 7,830,009 | B2 * | 11/2010 | Awano | B82Y 10/00 257/720 |
| 7,872,332 | B2 * | 1/2011 | Fay | H01L 24/03 257/621 |
| 8,309,396 | B2 * | 11/2012 | Ching | H01L 23/5283 438/108 |
| 8,664,760 | B2 * | 3/2014 | Yu | H01L 23/147 257/737 |
| 9,029,259 | B2 * | 5/2015 | Stupar | H01L 25/0657 438/667 |
| 9,496,154 | B2 * | 11/2016 | Tosaya | H01L 25/0657 |
| 9,520,381 | B2 * | 12/2016 | Higuchi | H01L 24/05 |
| 9,627,347 | B2 * | 4/2017 | Aoyagi | H01L 24/81 |
| 2010/0072631 | A1 | 3/2010 | Marion | |
| 2013/0075905 | A1 | 3/2013 | Choi et al. | |
| 2013/0241057 | A1 * | 9/2013 | Yu | H01L 25/0657 257/738 |
| 2014/0374919 | A1 | 12/2014 | Beyne et al. | |

OTHER PUBLICATIONS

Agarwal et al., High Density Cu—Sn TLP Bonding for 3D Integration, IEEE, Jun. 2009 Electronic Components and Technology Conference, pp. 345-349.

* cited by examiner

METHOD FOR SELF-ALIGNED SOLDER REFLOW BONDING AND DEVICES OBTAINED THEREOF

CROSS-REFERENCE TO RELATED APPLICATIONS

This application claims foreign priority to European Patent Application No. 15202661.3, filed Dec. 24, 2015, the contents of which are incorporated by reference herein in its entirety.

BACKGROUND

Technological Field

The present disclosure is related to a method for producing a stack of semiconductor devices by reflowing a solder material and the stack of semiconductor devices obtained by such a method.

Description of the Related Technology 3D semiconductor packaging technology stacked devices are used to reduce footprint and volume, as well as power consumption due to shorter interconnections. Typically thinned semiconductors are used in 3D bonding to reduce the height of the stack, which allows the use of Through Substrate Via (TSV) in multiple die stacking. "High Density Cu—Sn TLP Bonding for 3D Integration" by Rahul Agarwal, Wneqi Zhang, Paresh Limaye and Wouter Ruythooren from IMEC vzw, IEEE Paper 978-1-4244-4476-2/09 (June 2009), discloses a Cu/Sn/Cu bonding technique with a Transient Liquid Phase thermo-compression bonding technique, using a Cu UBM landing substrate and a Cu UBM with Sn Bump on the die substrate. During the TLP a solder Flux or Non-flow Under Fill (NUF) is required. The alignment accuracy is limited by the pick and place equipment, which in return limits further downscaling of the interconnects. Due to handling and BEOL reliability reasons, the pressure used during the bonding process becomes critical as scaling dictates that also the thickness of the devices to be stacked is further reduced to allow high count stacks using TSV. There is thus a need for an improved bonding process that allows thinner devices with smaller pitches for the bonding interconnect between the devices in the stack, while maintaining the low temperature of the bonding process.

SUMMARY OF CERTAIN INVENTIVE ASPECTS

It is an object of the present disclosure to provide a solder reflow based self-aligned bonding, between two semiconductor devices, for producing a stack of semiconductor devices.

It is an advantage of embodiments according to the present disclosure that an inherent self-alignment is obtained.

It is an advantage of embodiments according to the present disclosure that no pressure is needed during the formation of the stacked devices and in particular during the bond formation. This allows the use of thinned semiconductor device without risk of damaging them.

It is an advantage of embodiments according to the present disclosure that the method can be applied during die to wafer bonding as well as wafer to wafer bonding.

It is an advantage of embodiments according to the present disclosure that the method can be used to form stacks of more than two semiconductor devices, by repeating the method disclosed, wherein the second semiconductor device is a previously formed stack of devices according to embodiments of the present disclosure.

It is an advantage of embodiments according to the present disclosure that fine pitch protrusions devices can be stacked to the matching fine pitch holes, due to the self-alignment and the fact there is no overflow of solder between adjacent holes.

It is an advantage of embodiments according to the present disclosure that a capping layer protects the protrusions from oxidation prior to and during the formation of the stack of semiconductor devices.

It is an advantage of embodiments according to the present disclosure that there are no voids in the vicinity of the bonds or filled holes, which improves the reliability of the bond.

It is an advantage of embodiments according to the present disclosure that a contact is obtained on the whole common surface between the surfaces of the two semiconductor devices of the stack, avoiding the need of an underfill material and ensuring an auto sealing of the bonds.

It is an advantage of embodiments according to the present disclosure that the compliant layer absorbs the compressive stress, that exists after the solder reflow, between the two semiconductor devices that form the stack of devices and isolates adjacent bonds from one another.

The present disclosure is related to a method for producing a stack of semiconductor devices and the stacked device obtained by the method. The method includes providing a first semiconductor device comprising a dielectric layer with a hole, the hole lined with a metal layer and partially filled with solder material, and providing a second semiconductor device with a compliant layer having a metal protrusion through the compliant layer, the protrusion capped with a capping layer. The method includes mounting the devices by landing the metal protrusion in the hole, wherein the compliant layer is spaced from the dielectric layer. The method includes thereafter reflowing the solder material, thereby bonding the devices such that the compliant layer is contacting the dielectric layer.

In a first aspect the disclosure relates to a method for producing a stack of semiconductor devices. The method includes providing a first semiconductor device including a dielectric layer with an exposed upper surface, a hole through the dielectric layer, a sidewall and a bottom of the hole lined with a metal layer, a solder material on the metal layer partially filling the metal lined hole from the bottom upward thereby forming a solder hole. The method includes providing a second semiconductor device including a compliant layer with an exposed main surface, a metal protrusion through the compliant layer and the metal protrusion further extending perpendicular from the exposed main surface, a capping layer covering the metal protrusion and separating the metal protrusion from the compliant layer. The method includes mounting the second semiconductor device on the first semiconductor device by landing the metal protrusion in the solder hole, and contacting the solder material with the capping layer, wherein after mounting, the exposed main surface of the compliant layer is spaced from the exposed upper surface of the dielectric layer. The method includes thereafter reflowing the solder material, thereby filling the hole with reflowed material. After reflowing the semiconductor devices are bonded and the main surface of the compliant layer is contacting the upper surface of the dielectric layer.

According to embodiments of the present disclosure the capping layer includes a wetting material for the solder material.

It is an advantage of embodiments according to the present disclosure that the wetting material facilitates the self-alignment and improves the contact between the solder and the metal of the metal protrusion and the metal layer that lines the hole.

According to embodiments of the present disclosure the metal layer is a seed layer for the plating of the solder material.

It is an advantage of embodiments according to the present disclosure that the metal layer can be used as a seed layer for providing the solder material, thus simplifying the flow and cost of the disclosed method.

According to embodiments the metal lined hole has continuously sloped sidewalls and a circumference of the metal lined hole continuously decreasing closer to the bottom of the hole.

It is an advantage of embodiments according to the present disclosure that continuously sloped sidewalls improve the self-alignment during the solder reflow.

According to embodiments the reflowed material includes inter-metal-compounds (IMCs) formed from any of: the solder material and the capping layer, the solder material and the metal layer, and the solder material and the metal protrusion.

According to embodiments providing the first semiconductor device includes providing the hole in the dielectric layer; providing the metal layer on the dielectric layer; plating the solder material on the metal layer, using the metal layer as a seed layer; performing chemical mechanical polishing (CMP) thereby removing the solder material and dielectric layer thereby exposing the upper surface of the dielectric layer, and leaving the metal lined hole sidewalls covered with solder material and the metal lined hole partially filled with solder material.

It is an advantage of embodiments according to the present disclosure that the flow can be further optimized by combining steps and that plating allows good process control of the amount of solder filling the hole, while maintaining a cavity for the protrusion to land in and obtaining the desired flatness of the exposed surface of the dielectric layer.

According to embodiments of the present disclosure, the bottom of the hole through the dielectric layer exposes a contact pad of the first semiconductor device and the metal protrusion is part of a Through Substrate Via of the second semiconductor device.

In a second aspect the disclosure relates to a stack of semiconductor devices including a first semiconductor device including a dielectric layer with an upper surface, a hole through the dielectric layer, a sidewall and a bottom of the hole lined with a non-consumed metal layer. The stack of semiconductor devices includes a second semiconductor device including a compliant layer with a main surface, a metal protrusion through the compliant layer, a capping layer separating the metal protrusion from the compliant layer. The main surface of the compliant layer contacts the upper surface of the dielectric layer, and the hole is filled and includes a reflowed material. The reflowed material is bonded to the metal protrusion and to the non-consumed metal layer. The reflowed material can include a solder material.

It is an advantage of embodiments according to the present disclosure that a fine pitch soldered connection may be obtained.

It is an advantage of embodiments according to the present disclosure that a void free interface is obtained between the two surfaces of the semiconductor devices of the stack of devices.

According to embodiments the reflowed material further includes inter-metal-compounds (IMCs) formed from any of: the solder material and the material of the capping layer, the solder material and the material of the non-consumed metal layer, and the solder material and the material of the metal protrusion.

According to embodiments the hole has a continuously sloped sidewall and a circumference of the hole continuously decreases closer to the bottom of the hole.

According to embodiments the solder hole has an upper circumference that is larger than a bottom circumference of the capped metal protrusion.

According to embodiments the dielectric layer includes a second compliant layer.

According to embodiments the semiconductor devices include a plurality of matching solder holes and metal capped protrusions.

According to embodiments a barrier layer is present between the metal layer and the dielectric layer.

According to embodiments the metal layer includes a material selected from the list: Cu, Ni, W, Co.

According to embodiments the barrier layer includes a material selected from the list: cobalt, ruthenium, tantalum, tantalum nitride, indium oxide, tungsten nitride, and titanium nitride, Ti/TiW.

According to embodiments the solder material includes materials selected from the list: Sn, Sn based solders.

According to embodiments the metal protrusion includes a metal or a metal alloy composed of the elements selected from the list: Copper, Nickel, Tungsten, Aluminum.

BRIEF DESCRIPTION OF THE DRAWINGS

The present disclosure will now be described further, by way of example, with reference to the accompanying drawings. All figures are intended to illustrate some aspects and particular embodiments of the present disclosure. The figures are depicted in a simplified way for reason of clarity. Not all alternatives and options are shown and therefore the present disclosure is not limited to the content of the given drawings Like numerals are employed to reference like parts in the different figures.

All drawings are intended to illustrate some aspects and embodiments of the present disclosure. The drawings described are only schematic and are non-limiting.

DETAILED DESCRIPTION OF CERTAIN ILLUSTRATIVE EMBODIMENTS

The present disclosure will be described with respect to particular embodiments and with reference to certain drawings but the present disclosure is not limited thereto. In the drawings, the size of some of the elements may be exaggerated and not drawn to scale for illustrative purposes. The dimensions and the relative dimensions do not correspond to actual reductions to practice of the present disclosure.

Moreover, the term "top" and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference in this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of illustrative embodiments, various features of the present disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The present disclosure will now be described by a detailed description of several particular embodiments. It is clear that other particular embodiments can be configured according to the knowledge of persons skilled in the art without departing from the technical teaching of the present disclosure as defined by the appended claims.

In a first aspect, embodiments of the present disclosure relate to a method for producing a stack of semiconductor devices. The stack may be composed of at least two semiconductor devices, but may comprise more semiconductor devices, one stacked on top of the other, in accordance with embodiments of the present disclosure, forming a stack of semiconductor devices.

According to embodiments a first semiconductor device 100 and a second semiconductor device 200 may be provided, which may be a semiconductor integrated circuit (IC) as known to the skilled person. The semiconductor device may comprise a Front End Of Line (FEOL) and a Back End of Line (BEOL). The semiconductor device may be built up from layers of different materials like: a semiconductor substrate, for example Si or Ge, that may comprise: FEOL devices (transistors, diodes, resistors and the like); multiple dielectric materials layers comprising metallic interconnect structures forming the BEOL, for instance Cu Damascene BEOL, as known in the art. Other embodiments are possible as known to the skilled person in the art, such as but not limited to: semiconductor interposer, fully depleted SOI IC, memory IC. The semiconductor device may further comprise Through Substrate Via (TSV) 250 that enables higher count (more than two) semiconductor device stacking. These TSVs are known in the art of 3D semiconductor device stacking and may be fully or partially penetrating the semiconductor device.

Figure 1:
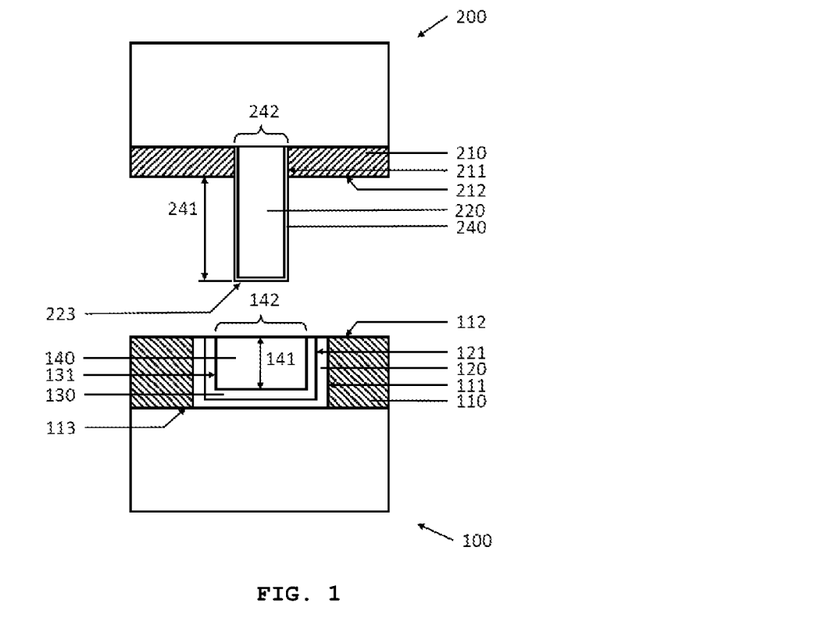
FIG. 1 illustrates a cross-section of an embodiment prior to bonding.
Figure 2:
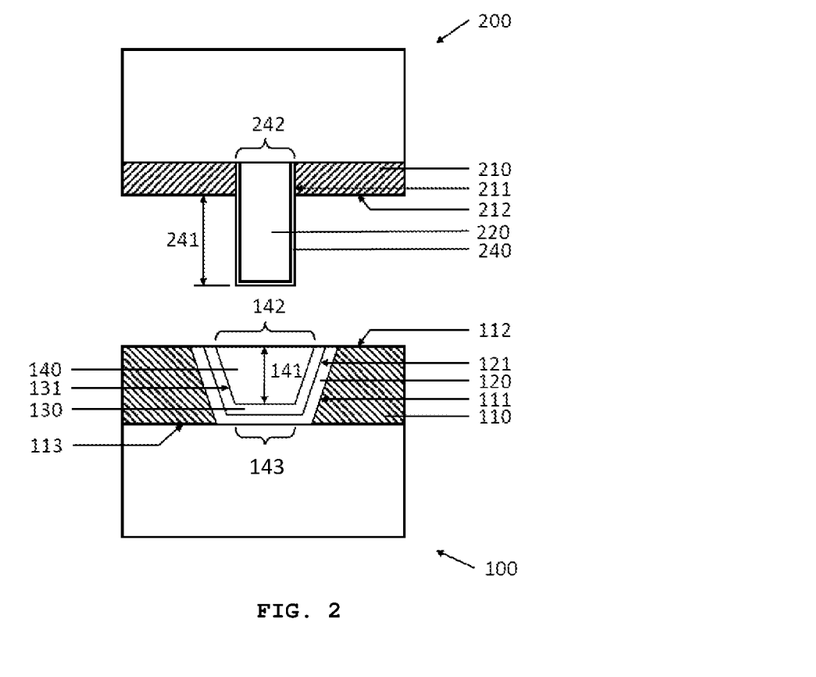
FIG. 2 illustrates a cross-section of an embodiment prior to bonding.

According to embodiments, such as those illustrated in FIG. 1 and FIG. 2, the first semiconductor device 100 further comprises a dielectric layer 110 with an exposed upper surface 112, and a hole 111 through the dielectric layer. The dielectric layer 110 may be formed on the BEOL of the first semiconductor device 100. The dielectric layer may be grown using Atomic Layer Deposition (ALD), deposited using Chemical Vapor Deposition (CVD) or coated by a spin-coating method in case of polymer or other known techniques. The dielectric layer material may comprise a material selected from the list: Silicon oxide (SiO2), Silicon Nitride, carbon or nitride doped Silicon Oxide (SiCO/SiCN) or a polymer based dielectric. The dielectric layer may be formed at wafer level during IC manufacturing. The exposed upper surface of the dielectric layer may be planarized to achieve a certain flatness of the exposed upper surface 112. The dielectric layer comprises a hole 111 extending from the exposed upper surface 112 to a bottom surface 113 of the dielectric layer. The hole 111 may be formed by etching, for example dry etching, laser drilling, exposure and development of photo-patternable polymer or by other known techniques.

According to embodiments, such as those illustrated in FIG. 1 and FIG. 2, the entire sidewall and bottom of the hole 111, in the dielectric layer 110, may be lined with a metal layer 120. The thus formed hole is thereby referred to as a metal lined hole 121. The metal layer may cover the inner surface of the hole 111. The metal layer may be conformal, which means the metal layer follows the contour of the underlying surface, i.e., the sidewall and bottom of the hole 111. The metal layer may comprise a material selected from the list: Cu, Ni, W, Co. The metal layer may be deposited using Physical Vapor Deposition (PVD), different plating techniques, for example electroplating using a Cu seed layer. A barrier layer (not shown in the figures) may further be present separating the metal layer from the dielectric layer, to avoid diffusion of the metal layer into the dielectric layer and to better adhere the metal to the dielectric. The barrier layer may comprise a material selected from the list: cobalt, ruthenium, tantalum, tantalum nitride, indium oxide, tungsten nitride, and titanium nitride, Ti/TiW or other metallic alloys by methods known in the state of the art.

According to embodiments, such as those illustrated in FIG. 1 and FIG. 2, a solder material 130 may be present on the metal layer 120 that lines the hole 111 in the dielectric layer. The inner surface, sidewalls and bottom of the metal lined hole 121 may be covered or lined with the solder material 130. The solder material 130 may partially fill the metal lined hole 121 from the bottom upward, as such forming a hole that is partially filled with solder material referred to as a solder hole 131. The solder hole 131 is leaving a vacancy 140, with an opening 142 in the exposed upper surface 112 and a depth 141, and a bottom opening 143 in the bottom of the solder hole. The solder hole is suitable for a metal protrusion to land in. The solder material may be provided conformal in the metal lined hole. The solder material may be electro-less, immersion or electroplated using the underlying metal layer as a seed layer. The solder material may be lead (Pb) free. The solder material may comprise materials from the list: Sn, Sn based solders, for example SnCu, SnAg, SnBi.

As illustrated in FIG. 1, the sidewalls of the hole 111 or metal lined hole 121 or solder hole 131 may be perpendicular to the exposed upper surface of the dielectric layer. As illustrated in FIG. 2, the hole 111 or metal lined hole 121 or solder hole 131 may comprise continuously sloped sidewalls and a circumference of the holes 111, 121, 131 may continuously decrease closer to the bottom of the hole. The continuous slope of the sidewall or the decrease of circumference may be linear, so that a straight line sidewall is obtained. The upper opening of the holes may be larger than the opening at the bottom of the respective hole.

According to embodiments a chemical mechanical polishing (CMP) may be performed that removes the solder material, the metal layer, the seed layer if present and a portion of the dielectric layer from a main upper surface of the first semiconductor device, thereby planarizing the exposed upper surface 112 of the dielectric layer, and further leaving the inner surface, sidewalls and bottom, of the hole 111 covered or lined with a metal layer thereby forming a metal lined hole 121. As such, the metal lined hole 121 inner surface, sidewalls and bottom, are covered with solder material and the metal lined hole 121 is partially filled with solder material thereby forming a solder hole 131. The solder hole 131 has a vacancy 140 comprising an opening 142 in the plane of the exposed upper surface of the dielectric layer and a depth 141 from that plane to the bottom of the solder hole.

According to embodiments the planarity or flatness of the exposed upper surface 112 of dielectric layer 110 after CMP may be below 3 nm, below 2 nm or below 1 nm.

According to embodiments a second semiconductor device 200 may be provided, which may be a semiconductor integrated circuit (IC) as known to the skilled person, similar to the description given above on the first semiconductor device.

According to embodiments, such as those illustrated in FIG. 1 and FIG. 2, the second semiconductor device 200 further comprises a compliant layer 210 with an exposed main surface 212. The exposed main surface 212 may be planarized, to obtain a desired flatness. The desired flatness may be less than 10 nm, less than 5 nm, less than 2 nm or less than 1 nm. The compliant layer may comprise a compliant material and may be a polyimide based polymer. The compliant layer may be deposited by spin-coating or other depositing methods known in the art. A compliant material allows a minor deformation that allows, for example, to embed residual particles between the bonding interface formed by the dielectric layer and the compliant layer during the formation of the stacked device. The compliant material may further provide a tackiness for the first semiconductor device 100 to bond with the second semiconductor device 200 and may be considered to some extent a soft material. The compliant layer is not intended to undergo large deformations; in the final stacked device the minor deformation may be limited to 0.1, 0.2 or 0.3 micrometer. The compliant layer remains stable during the solder reflow. A soft baked polymer may act as a compliant material.

According to embodiments, such as those illustrated in FIG. 1 and FIG. 2, the second semiconductor device comprises a metal protrusion 220, perpendicular to the exposed main surface, the metal protrusion extending fully through the compliant layer 210. The metal protrusion further extends perpendicular away from the exposed main surface 212 of the compliant layer. The latter part of the extended metal protrusion is also referred to as extended portion 241 of the metal protrusion and is configured to be landed in the vacancy 140 of the solder hole 131. The metal protrusion may comprise a metal or a metal alloy composed of the elements selected from the list: Copper, Nickel, Tungsten, and Aluminum. The extended metal protrusion may be produced by methods known in the art, such as but not limited to etching away a part of the compliant layer to expose a prefabricated metal protrusion. The etching may further provide an exposed main surface 212 on the remaining compliant layer, the exposed main surface 212 planarized by the etching step.

According to embodiments the planarity of the exposed main surface 212 of compliant layer after planarization may be below 30 nm, below 20 nm, below 10 nm, below 5 nm, or below 1 nm.

According to embodiments the dielectric layer 110 may also be a compliant layer or may comprise a second compliant layer (not shown in the figures). The second compliant layer may be deposited on the first semiconductor device, the second compliant layer being patterned to leave the partially filed solder hole 131 exposed, so that the capped metal protrusion 242 is configured to land in the solder hole 131. The metal protrusion covered by a capping layer according to some embodiments is referred to as the capped metal protrusion 242. The capping layer will be described in detail below.

According to embodiments, the method may further comprise a Chemical Mechanical Polishing step to planarize the exposed bottom surface 223 of metal protrusion 220. During this step the sidewalls of the metal protrusions may be enclosed by a support layer. The support layer fills the space between the metal protrusions and may be subjected to the CMP step. This step may be performed prior to adding a capping layer.

According to embodiments the planarity of the exposed bottom surface 223 of metal protrusion 220 after CMP may be below 30 nm, below 20 nm, below 10 nm, below 5 nm, or below 1 nm. It will be clear that the planarity is not only local (one protrusion) but also includes planarity for a second semiconductor device comprising multiple metal protrusions.

According to embodiments, such as those illustrated in FIG. 1 and FIG. 2, a capping layer 240 may cover the metal protrusion 220 and separate the metal protrusion 220 from the compliant layer 210. The capping layer 240 may further cover all exposed surfaces of the extended portion 241 of the metal protrusion 220. The capping layer may protect the metal protrusion from oxidation. The capping layer may comprise a material selected from the list: NiB, CoB, Au. The capping layer may comprise an NiB or CoB alloy that contains an atomic percentage of boron in the range of 10% to 50%. The capping layer may be a conformal layer. The capping layer may be thin compared to the metal protrusion, having a thickness in a range between 5 nm and 100 nm or between 5 nm and 50 nm or between 5 nm and 20 nm. The capping layer may comprise a wetting material or may be a wetting material. The capping layer may have a high surface energy for the corresponding solder material used. The solder material has a low contact angle for a given wetting material thereby reducing the surface tension of the molten solder and causing it to flow and wet the capped metal protrusion during the solder reflow. A capping layer comprising a wetting material helps the Sn of the solder to wet the metal of the metal protrusion and the metal layer.

Figure 3:
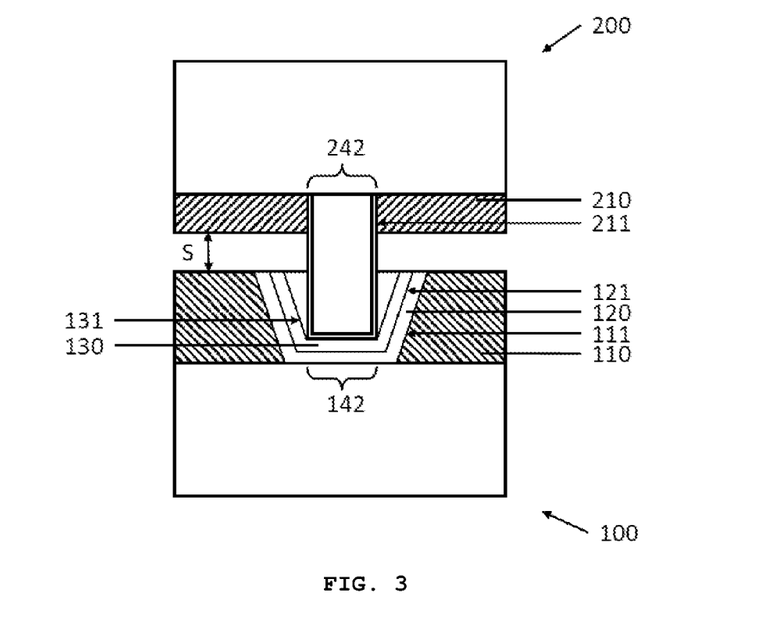
FIG. 3 illustrates a cross-section of an embodiment after the mounting step.

According to embodiments, such as illustrated in FIG. 3, the method comprises mounting the second semiconductor device 200 on the first semiconductor device 100 by landing the metal protrusion 220 in the partially filled solder hole 131, and contacting the solder material 130 with the capping layer 240, wherein after mounting, the exposed main surface 212 of the compliant layer 210 is spaced from the exposed upper surface 112 of the dielectric layer 110.

According to embodiments the method may comprise, prior to landing the metal protrusion in the partially filled solder hole 131: aligning the first and second semiconductor device to each other such that the exposed surfaces of the semiconductor devices are facing each other and the capped metal protrusion 242 may be located in front of the solder hole and the two semiconductor devices are distant from each other. To finish the mounting the metal protrusion may be landed, by lowering the second semiconductor device, into the vacancy 140, of the partially filled solder hole 131, through the opening 142. After mounting, a spacing S, or clearance, separates the exposed upper surface 112 from the exposed main surfaces 212 of the facing semiconductor devices 100 and 200. Mounting the semiconductor devices does not include bonding the semiconductor devices to one another. The second semiconductor device may be landed on top of the first semiconductor device, by a pick and place equipment as known in the art. After landing the first semiconductor device may be released. After release the first semiconductor device may be kept in its landed position, so as to maintain the spacing S. To maintain its position a small force may be applied on the second semiconductor device directed towards the first semiconductor device. The small force may be in the order of 10-100 milli-Newton on an area of 5 square millimeters. In any case, this results in a pressure far below the pressure needed for insertion or thermocompression bonding. Another method to align the top semiconductor device over the bottom semiconductor device is to use a self-align approach. The self-aligned method can be fluidic, electric, magnetic or combination of different methods. The mounting may alternatively be performed by a self-aligned fluid method. This method may require a temperature step to evaporate the liquid used during self-alignment. The evaporation temperature must be lower than the melting temperature of the solder material. It will be clear that no bonding between the two semiconductor devices has taken place before or during the mounting step. The second semiconductor device after landing on the first semiconductor device may be kept in place on the first semiconductor device by suitable means, for example by electrostatic, magnetic or capillary force.

Figure 4:
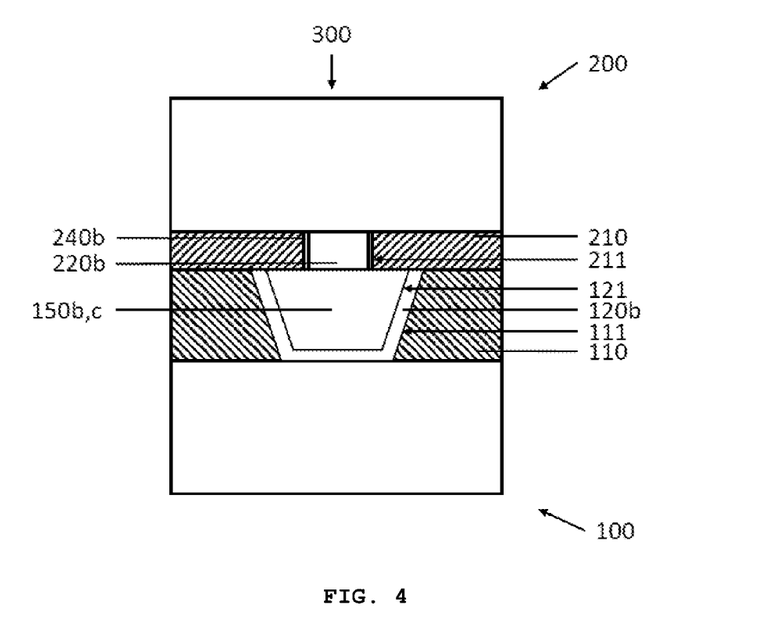
FIG. 4 illustrates a cross-section of an embodiment representing a stacked device.

According to embodiments, such as illustrated in FIG. 4, the method comprises, after mounting the semiconductor devices, reflowing the solder material 130, thereby filling the hole 111. The filled hole 111 comprises a reflowed material 150b, wherein after reflowing the semiconductor devices 100 and 200 are bonded and the main surface of the compliant layer 212 contacts the upper surface 112 of the dielectric layer. Solder reflow is a known technique for metal/solder/metal soldered connections (Solid-Liquid Inter Diffusion interconnect SLID), for example Cu/Sn/Cu. The solder may be heated to temperatures of about 250 degrees Celsius for a period of 2 to 10 seconds, with a ramp up and ramp down time of 1-3 seconds for heating and cooling. The heating may be done through a chuck on which the semiconductor devices are mounted. Temperatures in the chuck may be higher, up to 400 degrees Celsius. It will be clear that the exact temperature profile may have multiple phases and temperatures. This depends on the materials used, the volumes of solder used, the thickness of the semiconductor devices used, and many other parameters. A skilled person in the art will be able to obtain the correct reflow conditions for different variations of shape and materials so as to form a qualitative and reliable bond using the method described in the various embodiments disclosed herein. It will be clear that the aim is to keep the solder reflow temperature below temperatures that would be detrimental to the semiconductor devices and 5-10 degrees Celsius above the melting point of the solder material, so below 400 degrees Celsius and more preferably below 350, 300, or even 250 degrees Celsius.

During the reflow, the solder material in the solder hole starts to melt. The capping layer, which may be a wetting material for the solder, is pulled towards the liquid solder as a result of the low contact angle, thereby achieving an self-alignment between the two semiconductor devices, and as the reflow continues inter-metal-compounds (IMCs) are formed. This self-alignment may be further aided by the sloped sidewalls, if present, of the metal lined hole 121.

As previously stated the capping layer may be a thin layer and has a low volume compared to the metal protrusion and solder volume. The part of the capping layer in contact with the solder will, during the initial reflow stage, be the first layer to be consumed in the liquid solder and form IMCs with the solder components. The metal layer 120 lining the hole 111 may be partially consumed in the formation of IMCs with the solder components during the reflowing of the solder material. Also the metal protrusion may be partially consumed as it comes into contact with the reflowed solder to form IMCs with the solder components. After reflow a bond is achieved and the hole 111 is filled, the filled hole 111 comprising reflowed material 150b. The filled hole 111 further comprises the non-consumed portion of metal layer 120b and the non-consumed portion of the extended metal protrusion 150c. Note that 150b, 150c are shown as one shape in FIG. 4 and FIG. 5, this to indicate that the filled hole 111 comprises both 150b and 150c next to 120b. The non-consumed portions refer to the portions that are not part of the formation of the IMCs. The reflowed material 150b comprises inter-metal-compounds (IMCs) formed from any combination of: the solder material and the material of the capping layer, the solder material and the material of the metal layer, the solder material and the material of the metal protrusion.

In the ramp down phase of the reflow the temperature may be lowered to room temperature and the solder will solidify forming a permanent bond between the first and second semiconductor device of the stacked device. As the reflowed material 150b cools it also shrinks in volume and causes a force pulling the two semiconductor devices towards each other, thereby reducing the spacing S between the two semiconductor devices, that existed prior to the reflow. As a result the main surface of the compliant layer and the upper surface of the dielectric layer are no longer exposed and contact each other. Further shrinking pulls the two semiconductor devices closer together. The compressive stress caused by this further pulling may be absorbed by the compliant layer, which causes a minor deformation in the direction of the force, without affecting the capping layer 240b and metal protrusion 220b that are enclosed by the compliant layer. The upper surface 112 and main surface 212 will no longer be exposed and contact each other on their whole common surface as illustrated in FIG. 4. The hole may be completely filled after bonding. The compliant layer will be submitted to a compressive stress in the direction of the pulling force after bonding.

Fully filling the hole 111 after reflow/bonding and achieving a desired compressive stress on the compliant layer may be achieved by optimizing a number of parameters that need to be in balance. These parameters include but are not limited to: the volume of the vacancy 140, the volume of the extended capped metal protrusion 241, the planarity of the upper and main surfaces, the solder material, the solder reflow profile (temperature vs. time), the wetting material. The volume of the vacancy 140 in the solder hole and the volume of the extended capped metal protrusion 241 may be about equal.

According to embodiments a cleaning of the exposed upper surface 112 and the exposed main surfaces 212 may be performed prior to reflowing the solder material.

Figure 5:
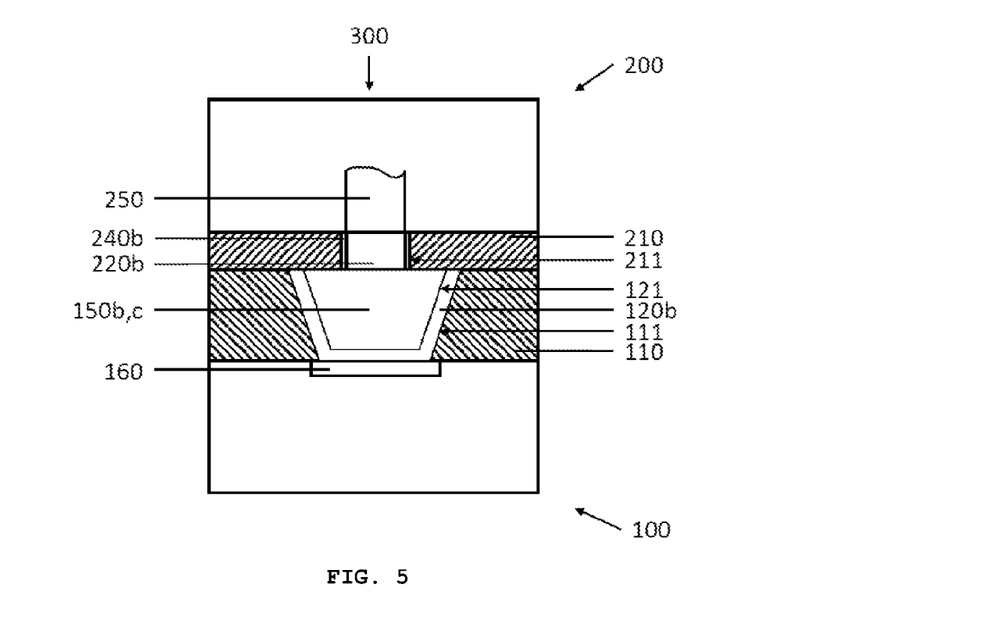
FIG. 5 illustrates a cross-section of an embodiment representing a stacked device.

According to embodiments, such as illustrated in FIG. 5, the bottom of the hole 111 through the dielectric layer 110 exposes a contact pad 160 of the first semiconductor device 100. FIG. 5 further illustrates the metal protrusion 230 may be part of a Through Substrate Via 250 of the second semiconductor device 200. The contact pad 160 and TSV 250 may be further connected in their respective semiconductor device to internal signals of the BEOL and to FEOL devices.

Figure 6A:
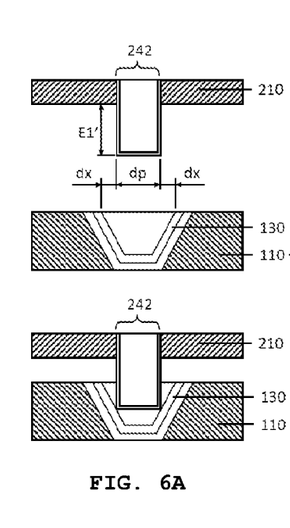
FIGS. 6A, 6B, and 6C illustrate six cross-sections of three different embodiments, with different slopes of the hole (111, 121, 131), before and after the mounting step.
Figure 6B:
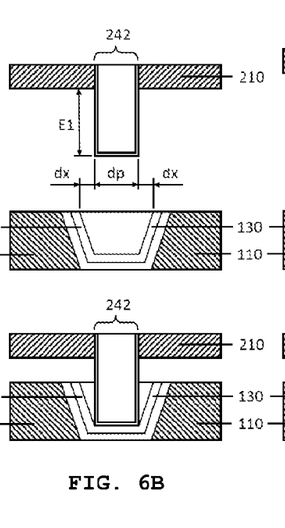
Figure 6C:
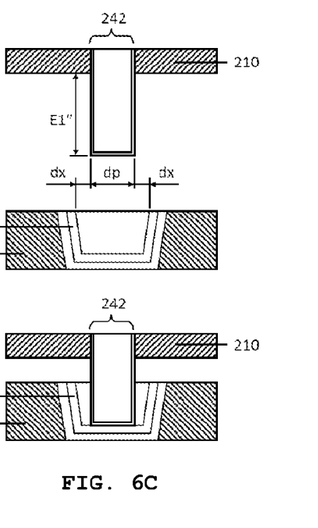

FIGS. 6A, 6B, 6C, 7A, 7B, and 7C illustrate the relation between the opening 142 in the exposed upper surface of the dielectric layer and the dimensions of the metal protrusion. For clarity only the dielectric layer, holes and compliant layer with capped protrusion are shown. The alignment of the metal protrusion with the vacancy opening may be limited due to precision of pick and place or other alignment techniques represented by displacement dx in FIGS. 6A, 6B, 6C, 7A, 7B, and 7C. Opening 142 can be spaced by at least dx on all side of the metal protrusion. The metal protrusion has a largest dimension dp at the bottom surface 223 of the metal protrusion. The opening 142 of the vacancy can be at least equal to dp plus two times dx in any direction of the plane of the exposed upper surface so that the metal protrusion can land in the vacancy and can cope with the limited precision of the alignment. Applying this principle allows for the smallest pitch possible between two adjacent holes 111. As further illustrated by FIGS. 6A, 6B, and 6C, the capped metal protrusion 242 can land on the sidewall as illustrated in FIG. 6A or the bottom of the solder hole as illustrated in FIG. 6B and FIG. 6C. FIG. 6B illustrates the situation where the bottom dimension of the hole dh is equal to dp. FIG. 6C illustrates the situation where the dimension at the bottom of the solder hole dh is larger than dp. The height of the extension 241 of the capped metal protrusion, is defined by the dimension E1, E1', E1", E2, E2' or E2" of the extended capped protrusion as illustrated in FIGS. 6A, 6B, 6C, 7A, 7B, and 7C, and may be approximately equal to the available volume in the vacancy 140, for the metal protrusion to land in, prior to landing the metal protrusion in the vacancy.

Figure 7A:
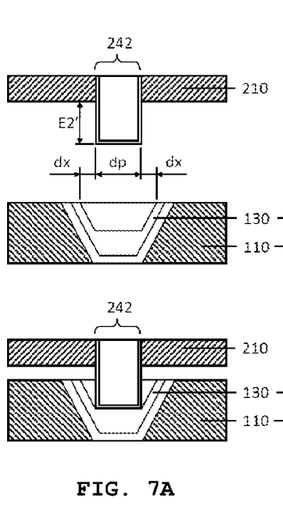
FIGS. 7A, 7B, and 7C illustrate six cross-sections of three different embodiments, with different solder filling of the hole (111, 121, 131) before and after the mounting step.
Figure 7B:
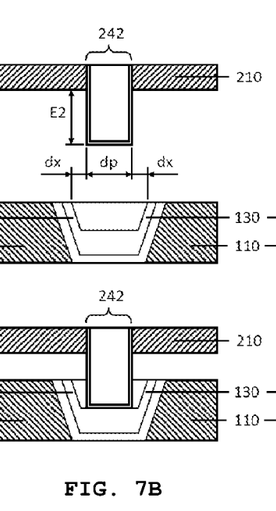
Figure 7C:
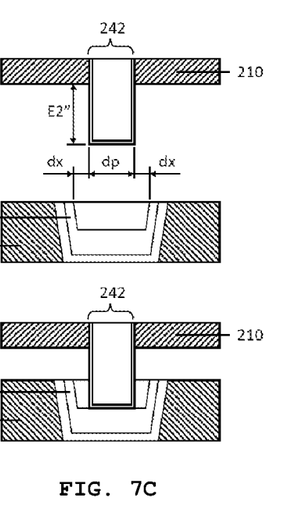

According to embodiments, such as illustrated in FIGS. 7A, 7B, and 7C, the bottom of the solder hole comprises thicker solder layer than the sidewalls. This decreases volume of the vacancy and thus the height of the metal protrusion, and further increases the amount of solder in the final reflowed material 150b, if all other dimensions remain the same. It will be clear to the skilled person that the given solder material distribution in FIGS. 6A, 6B, 6C, 7A, 7B, and 7C are examples and the current disclosure is not limited to these examples.

The method according to the first aspect of the disclosure may be used in die to die bonding, die to wafer bonding and wafer to wafer bonding. It will be clear to the skilled person that both semiconductor devices may comprise a plurality of matching solder holes and a plurality of metal protrusions. After bonding the matching solder holes and protrusions form a plurality of bonds that each comprise reflowed material 150b, the reflowed material bonded to the metal protrusion 220b and to the metal layer 120b lining the plurality of holes, the reflowed material comprising a solder material.

In one embodiment of the method a silicon semiconductor IC with a silicon oxide (SiO2) dielectric layer 110, having a copper (Cu) lined hole 121, partially filled with an tin (Sn) based, lead (Pb) free, solder material 130 is used as the first semiconductor device 100, and a further silicon semiconductor IC having a polyimide complaint layer 210, with a copper (Cu) protrusion and a NiB or CoB capping layer 240 is used as a second semiconductor device 200.

In another embodiment, the overall thickness of the first and second semiconductor devices, perpendicular to the upper and main surfaces respectively, is in the range of 20-200 micrometers, 30-100 micrometers, or 30-50 micrometers. These thicknesses can be achieved by known methods, like back grinding, CMP, etching and the likes. The capped metal protrusion 242 or capped TSV 250 outer dimension dp in the plane of the exposed main surface are in the range of 2-20 micrometers, or 3-10 micrometers. The metal protrusion and TSV may be circular in the plane of the exposed main surface, but other shapes as known in the art are possible. Current alignment equipment and techniques have displacement errors dx in the range of 0.1-2 micrometers. The thickness of the dielectric layer is in the range of 1-10 micrometers, 2-5 micrometers or 3-4 micrometers. The solder hole has an upper circumference that is larger than a bottom circumference of the capped metal protrusion 242. The capped metal protrusion 242 is preferably landed on the bottom of the solder hole. The thickness of the compliant layer is in the range of 1-10 micrometers, or 2-5 micrometers. The bottom dimension dh of the bottom opening 143 in the bottom of the solder hole 131 is preferably equal to or larger than the capped metal protrusion 242 outer dimension dp as shown in FIGS. 6B and 6C and FIGS. 7B and 7C. The bottom opening 143 of the solder hole is equal to or smaller than the vacancy opening 142 in the solder hole. The spacing S or clearance is dependent on the different dimension used and may be minimum 1, 2 or 3 micrometers.

In a second aspect, the embodiments of the present disclosure relate to a stack of semiconductor devices 300 that may be produced according to the methods according to the first aspect of the disclosure.

According to embodiments, such as those illustrated in FIG. 4 and FIG. 5, the stack of semiconductor devices 300 comprises a first semiconductor device 100 and a second semiconductor device 200. The first semiconductor device 100 comprises a dielectric layer, the dielectric layer having an upper surface 112, a hole 111 through the dielectric layer. The hole 111 extends from the upper surface 112 to a bottom surface 113 of the dielectric layer. A sidewall and a bottom of the hole 111 may be lined with a non-consumed portion of a metal layer 120b. A detailed description of the first semiconductor device features, dielectric layer and hole features, is already explained in embodiments of the first aspect of the disclosure, and apply also for the second aspect. The second semiconductor device 200 comprises a compliant layer 210 with a main surface 212, a metal protrusion 220b extending through the compliant layer 210, perpendicular to the main surface 212. The metal protrusion 220b is separated from the compliant layer by a capping layer 240b. The metal protrusion 220b has the same material features as metal protrusion 220. The capping layer 240b has the same material features as capping layer 240. A detailed description of the second semiconductor device features, compliant layer, metal protrusion and capping layer features is already explained in embodiments of the first aspect of the disclosure, and apply also for the second aspect.

According to embodiments illustrated in FIG. 4 and FIG. 5, in the stack of semiconductor devices 300, the main surface of the compliant layer 212 of the second semiconductor device contacts the upper surface of the dielectric layer 112 of the first device. The main surface and upper surface, being substantially planar, are in contact in the common areas of both surfaces. As a result of a solder reflow the filled hole 111 comprises a reflowed material 150b. The reflowed material in the hole 111 bonds the first semiconductor and second semiconductor to each other. The compliant layer absorbs any compressive stress that exists between the first and second semiconductor device. The thus bonded semiconductor devices form a stack of semiconductor devices. The reflowed material may be bonded to a non-consumed portion the metal protrusion 150c that is comprised within the filled hole. The non-consumed metal protrusion 150c may be an extension from the metal protrusion 220b extending downward into the hole 111 of the first semiconductor device. The reflowed material is further bonded to the non-consumed metal layer 120b. The reflowed material comprises a solder material. A detailed description of the reflowed material features and methods of fabrication thereof, is already explained in embodiments of the first aspect of the disclosure, and apply also for the second aspect.

According to embodiments the reflowed material 150b further comprises inter-metal-compounds (IMCs) formed from any combination of: the solder material 130 and the material of the capping layer 240b, the solder material 130 and the material of the non-consumed metal layer 120b, the solder material 130 and the material of the metal protrusion 220b.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for producing a stack of semiconductor devices, the method comprising:
    providing a first semiconductor device, the first semiconductor device comprising: a dielectric layer with an exposed upper surface, a hole through the dielectric layer, a sidewall and a bottom of the hole lined with a metal layer, a solder material on the metal layer partially filling the metal lined hole from the bottom upward thereby forming a solder hole;
    providing a second semiconductor device, the second semiconductor device comprising: a compliant layer with an exposed main surface, a metal protrusion through the compliant layer and the metal protrusion further extending perpendicular from the exposed main surface, a capping layer covering the metal protrusion and separating the metal protrusion from the compliant layer;
    mounting the second semiconductor device on the first semiconductor device by landing the metal protrusion in the solder hole, and contacting the solder material with the capping layer, wherein after mounting, the exposed main surface of the compliant layer is spaced from the exposed upper surface of the dielectric layer; and
    after mounting the second semiconductor device on the first semiconductor device, reflowing the solder material, thereby filling the hole with reflowed material, wherein after reflowing the first semiconductor device and the second semiconductor device are bonded and the main surface of the compliant layer is contacting the upper surface of the dielectric layer.

2. The method according to claim 1, wherein the capping layer comprises a wetting material for the solder material.

3. The method according to claim 1, wherein the metal layer is a seed layer for plating of the solder material.

4. The method according to claim 1, wherein the metal lined hole has continuously sloped sidewalls and a circumference of the metal lined hole continuously decreases closer to the bottom of the hole.

5. The method according to claim 1, wherein the reflowed material comprises inter-metal-compounds (IMCs) formed from any of: the solder material and the capping layer, the solder material and the metal layer, and the solder material and the metal protrusion.

6. The method according to claim 1, wherein providing the first semiconductor device comprises:
    providing the hole in the dielectric layer;
    providing the metal layer on the dielectric layer;
    plating the solder material on the metal layer, using the metal layer as a seed layer; and
    performing chemical mechanical polishing (CMP), thereby removing the solder material and dielectric layer to expose the upper surface of the dielectric layer, and leaving the metal lined hole sidewalls covered with solder material and the metal lined hole partially filled with solder material.

7. A method according to claim 1, wherein the bottom of the hole through the dielectric layer exposes a contact pad of the first semiconductor device, and the wherein the metal protrusion is part of a Through Substrate Via of the second semiconductor device.

8. A stack of semiconductor devices comprising:
a first semiconductor device comprising a dielectric layer with an upper surface, and a hole through the dielectric layer, a sidewall and a bottom of the hole lined with a non-consumed metal layer; and
a second semiconductor device comprising a compliant layer with a main surface, a metal protrusion through the compliant layer, and a capping layer separating the metal protrusion from the compliant layer, wherein the main surface of the compliant layer contacts the upper surface of the dielectric layer, wherein the hole is filled and comprises a reflowed material, the reflowed material bonded to the metal protrusion and to the non-consumed metal layer, the reflowed material comprising a solder material.

9. The stack of semiconductor devices according to claim 8, wherein the reflowed material further comprises inter-metal-compounds (IMCs) formed from any of: the solder material and the material of the capping layer, the solder material and the material of the non-consumed metal layer, and the solder material and the material of the metal protrusion.

10. The stack of semiconductor devices according to claim 8, wherein the hole has a continuously sloped sidewall and a circumference of the hole continuously decreases closer to the bottom of the hole.

* * * * *